(12) United States Patent
Ko et al.

(10) Patent No.: US 9,177,935 B2
(45) Date of Patent: Nov. 3, 2015

(54) SEMICONDUCTOR DEVICE CONNECTED BY ANISOTROPIC CONDUCTIVE FILM HAVING A RELIABILITY ADHESIVE STRENGTH

(71) Applicants: Youn Jo Ko, Uiwang-si (KR); Hye Su Ki, Uiwang-si (KR); Ie Ju Kim, Uiwang-si (KR)

(72) Inventors: Youn Jo Ko, Uiwang-si (KR); Hye Su Ki, Uiwang-si (KR); Ie Ju Kim, Uiwang-si (KR)

(73) Assignee: CHEIL INDUSTRIES, INC., Gumi-si, Kyeongsangbuk-do (KR)

( * ) Notice: Subject to any disclaimer, the term of this patent is extended or adjusted under 35 U.S.C. 154(b) by 0 days.

(21) Appl. No.: 14/163,113

(22) Filed: Jan. 24, 2014

(65) Prior Publication Data

US 2014/0210084 A1      Jul. 31, 2014

(30) Foreign Application Priority Data

Jan. 25, 2013   (KR) .................. 10-2013-0008546

(51) Int. Cl.
 *H01L 23/48*  (2006.01)
 *H01L 23/52*  (2006.01)
 *H01L 29/40*  (2006.01)
 (Continued)

(52) U.S. Cl.
 CPC . *H01L 24/32* (2013.01); *C09J 9/02* (2013.01); *H01L 24/29* (2013.01); *H01L 24/83* (2013.01); *H01L 2224/131* (2013.01); *H01L 2224/13147* (2013.01); *H01L 2224/16238* (2013.01); *H01L 2224/293* (2013.01); *H01L 2224/294* (2013.01); *H01L 2224/2929* (2013.01); *H01L 2224/2939* (2013.01); *H01L 2224/29339* (2013.01); *H01L 2224/29344* (2013.01);
 (Continued)

(58) Field of Classification Search
 CPC .......... H01L 2924/01079; H01L 2924/01013; H01L 2224/16; H01L 2924/01029; H01L 24/83; H01L 2224/48091; H01L 23/293; H01L 21/563; H01L 2224/73203; H01L 23/295; H01L 24/32; H01L 2924/07802
 USPC ......... 257/746, 778, 782, 783, 787, 788, 789, 257/792, 795
 See application file for complete search history.

(56) References Cited

U.S. PATENT DOCUMENTS

| 8,163,835 B2 | 4/2012 | Park et al. |
| 2009/0078747 A1 | 3/2009 | Park et al. |

FOREIGN PATENT DOCUMENTS

| JP | 2012-97226   | * | 5/2012 |
| JP | 2012-097226 A |   | 5/2012 |

(Continued)

OTHER PUBLICATIONS

Office Action dated Apr. 9, 2015 in corresponding Chinese Patent Application No. 201410037692.7.

(Continued)

*Primary Examiner* — A. Sefer
*Assistant Examiner* — Dilinh Nguyen
(74) *Attorney, Agent, or Firm* — Lee & Morse, P.C.

(57) ABSTRACT

A semiconductor device connected by an anisotropic conductive film, the anisotropic conductive film including a binder resin; a first radical polymerization material having one or two (meth)acrylate reactive groups in a structure thereof and a second radical polymerization material having at least three (meth)acrylate reactive groups in a structure thereof; and conductive particles, the anisotropic conductive film having a moisture permeability of 170 $g/m^2/24$ hr or less and a moisture absorbency of 2% or less.

13 Claims, 1 Drawing Sheet

(51) Int. Cl.
*H01L 23/28* (2006.01)
*H01L 23/29* (2006.01)
*H01L 23/00* (2006.01)
*C09J 9/02* (2006.01)

(52) U.S. Cl.
CPC ............... *H01L 2224/29347* (2013.01); *H01L 2224/29355* (2013.01); *H01L 2224/29386* (2013.01); *H01L 2224/29393* (2013.01); *H01L 2224/29499* (2013.01); *H01L 2224/81193* (2013.01); *H01L 2224/81903* (2013.01); *H01L 2224/83851* (2013.01); *H01L 2224/9211* (2013.01); *H01L 2924/07802* (2013.01)

(56) References Cited

FOREIGN PATENT DOCUMENTS

KR 10-2009-0030626 A 3/2009
TW 2009 25237 A 6/2009

OTHER PUBLICATIONS

Taiwanese Office Action for 10420573600 dated May 4, 2015; Ko, et al.

* cited by examiner

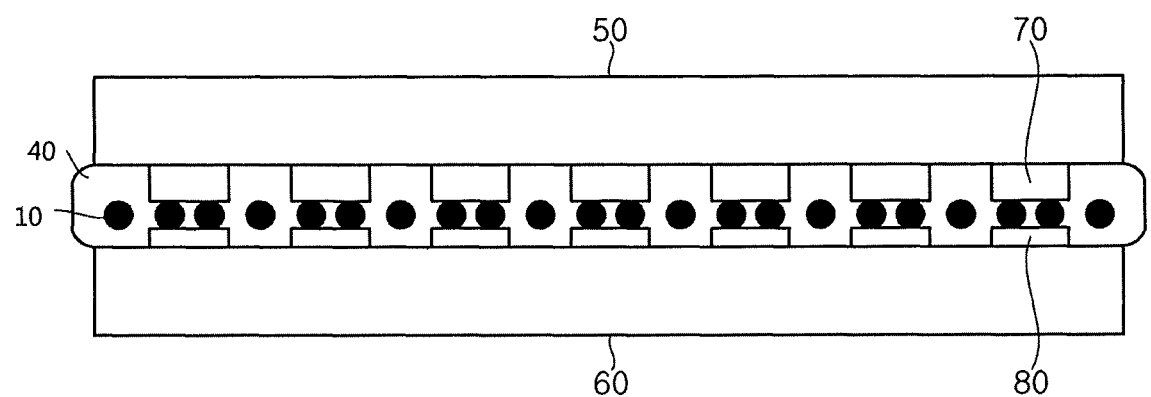

SEMICONDUCTOR DEVICE CONNECTED BY ANISOTROPIC CONDUCTIVE FILM HAVING A RELIABILITY ADHESIVE STRENGTH

CROSS-REFERENCE TO RELATED APPLICATION

Korean Patent Application No. 10-2013-0008546 filed on Jan. 25, 2013, in the Korean Intellectual Property Office, and entitled: "SEMICONDUCTOR DEVICE CONNECTED BY ANISOTROPIC CONDUCTIVE FILM," is incorporated by reference herein in its entirety.

BACKGROUND

1. Field

Embodiments relate to a semiconductor device connected by an anisotropic conductive film.

2. Description of the Related Art

Generally, anisotropic conductive films (ACFs) refer to film-shaped adhesives in which conductive particles, such as metal particles including nickel or gold particles or metal-coated polymer particles, are dispersed in a resin, such as an epoxy resin. Anisotropic conductive films may be formed of polymer layers having electric anisotropy and adhesiveness, and may exhibit conductive properties in the thickness direction of the films and insulating properties in the surface direction thereof.

When an anisotropic conductive film is disposed between circuit boards and is subjected to heating and compression under certain conditions, circuit terminals of the circuit boards may be electrically connected through conductive particles and an insulating adhesive resin may fill spaces between adjacent circuit terminals to isolate the conductive particles from each other, thereby providing high insulation between the circuit terminals.

SUMMARY

Embodiments are directed to a semiconductor device connected by an anisotropic conductive film.

The embodiments may be realized by providing a semiconductor device connected by an anisotropic conductive film, the anisotropic conductive film including a binder resin; a first radical polymerization material having one or two (meth)acrylate reactive groups in a structure thereof and a second radical polymerization material having at least three (meth)acrylate reactive groups in a structure thereof; and conductive particles, the anisotropic conductive film having a moisture permeability of 170 g/m²/24 hr or less and a moisture absorbency of 2% or less.

The anisotropic conductive film may have a reliability adhesive strength of 400 gf/cm or more, as measured after being subjected to pre-compression under conditions of 60° C. to 80° C. at 1.0 MPa to 4.0 MPa for 1 second to 3 seconds and primary compression under conditions of 170° C. to 200° C. at 2.5 MPa to 7 MPa for 1 second to 7 seconds with a release film removed from the pre-compressed anisotropic conductive film, and being left at a temperature of 85° C. and a relative humidity of 85% for 500 hours.

The anisotropic conductive film may have s a reliability connection resistance of 3Ω or less, as measured after being subjected to pre-compression under conditions of 60° C. to 80° C. at 1.0 MPa to 4.0 MPa for 1 second to 3 seconds and primary compression under conditions of 170° C. to 200° C. at 2.5 MPa to 7 MPa for 1 second to 7 seconds with a release film removed from the pre-compressed anisotropic conductive film, and being left at a temperature of 85° C. and a relative humidity of 85% for 500 hours.

The anisotropic conductive film may have a reliability bubbling area of 20% or less, as measured after being subjected to pre-compression under conditions of 60° C. to 80° C. at 1.0 MPa to 4.0 MPa for 1 second to 3 seconds and primary compression under conditions of 170° C. to 200° C. at 2.5 MPa to 7 MPa for 1 second to 7 seconds with a release film removed from the pre-compressed anisotropic conductive film, and being left at a temperature of 85° C. and a relative humidity of 85% for 500 hours.

The anisotropic conductive film may include 30 wt % to 80 wt % of the binder resin; 6 wt % to 60 wt % of the radical polymerization materials; and 0.1 wt % to 20 wt % of the conductive particles, all in terms of solid content.

A weight ratio of the first radical polymerization material to the second radical polymerization material (first radical polymerization material/second radical polymerization material) may range from 1 to 10.

The binder resin may include at least two types of resins having different weight average molecular weights.

The binder resin may include at least two types of resins selected from the group of acrylonitrile-butadiene rubber resins, polyurethane resins, or acryl resins.

The first radical polymerization material may include at least one selected from the group of hydroxybutyl (meth)acrylate, methyl (meth)acrylate, ethyl (meth)acrylate, n-butyl (meth)acrylate, isobutyl (meth)acrylate, 2-hydroxypropyl (meth)acrylate, or glycidyl (meth)acrylate.

The second radical polymerization material may include at least one selected from the group of pentaerythritol tri(meth)acrylate, trimethylolpropane tri(meth)acrylate, tri(meth)acrylate of ethylene oxide-modified trimethylolpropane, pentaerythritol tetra(meth)acrylate, or dipentaerythritol hexa (meth)acrylate.

The anisotropic conductive film may further include inorganic particles.

The inorganic particles may be present in an amount of 0.1 wt % to 20 wt %, based on a total weight of the anisotropic conductive film in terms of solid content.

The embodiments may be realized by providing a semiconductor device including a first connecting member including a first electrode; a second connecting member including a second electrode; and an anisotropic conductive film between the first connecting member and the second connecting member and bonding the first electrode to the second electrode, the anisotropic conductive film including a binder resin; a first radical polymerization material having one or two (meth)acrylate reactive groups in a structure thereof and a second radical polymerization material having at least three (meth)acrylate reactive groups in a structure thereof; and conductive particles, the anisotropic conductive film having a moisture permeability of 170 g/m²/24 hr or less and a moisture absorbency of 2% or less.

BRIEF DESCRIPTION OF THE DRAWING

Features will be apparent to those of skill in the art by describing in detail exemplary embodiments with reference to the attached drawing in which:

FIG. 1 illustrates a sectional view of a semiconductor device.

DETAILED DESCRIPTION

Example embodiments will now be described more fully hereinafter with reference to the accompanying drawing;

however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. Like reference numerals refer to like elements throughout.

The embodiments provide a semiconductor device connected by an anisotropic conductive film. The anisotropic conductive film may be prepared using at least two types of radical polymerization materials having different numbers of reaction or reactive groups in structures thereof to provide low moisture permeability and low moisture absorbency while exhibiting excellent long-term reliability.

An embodiment provides a semiconductor device connected by an anisotropic conductive film, which may include, e.g., (a) a binder resin; (b) a first radical polymerization material having one or two (meth)acrylate reactive groups in a structure thereof and a second radical polymerization material having at least three (meth)acrylate reactive groups in a structure thereof; and (c) conductive particles. The film may have a moisture permeability of 170 $g/m^2/24$ hr or less and a moisture absorbency of 2% or less.

Next, the respective components of an anisotropic conductive film according to embodiments will be described in more detail. Herein, the content of each component is based on the total weight of an anisotropic conductive film composition. Further, in preparation of the anisotropic conductive film, each of the components may be dissolved in an organic solvent and deposited onto a release film, followed by drying for a predetermined time for evaporation of the organic solvent. Thus, a solid anisotropic conductive film may also contain the respective components of the anisotropic conductive film composition.

a) Binder Resin

A suitable binder resin may be used. Examples of the binder resin may include an acrylonitrile-butadiene rubber (NBR) resin, a polyurethane resin, an acryl resin, a polyester urethane resin, or the like.

Acrylonitrile-Butadiene Rubber Resin

The acrylonitrile-butadiene rubber resin refers to a copolymer prepared through emulsion polymerization of acrylonitrile and butadiene. In the copolymer, suitable amounts of the acrylonitrile and the butadiene may be included and the copolymer may be prepared by a suitable polymerization method. The acrylonitrile-butadiene rubber resin may have a weight average molecular weight of, e.g., 50,000 g/mol to 1,000,000 g/mol.

Polyurethane Resin

The polyurethane resin refers to a polymer resin having a urethane bond, and may be prepared through polymerization of, e.g., isophorone diisocyanate, polytetramethylene glycol, or the like. The polyurethane resin may have a weight average molecular weight of, e.g., 10,000 g/mol to 200,000 g/mol, without being limited thereto.

Acryl Resin

The acryl resin may be prepared through polymerization of an acryl monomer and/or other monomers polymerizable therewith. For example, the acryl resin may be prepared by polymerization of at least one monomer selected from the group of a $C_2$ to $C_{10}$ alkyl group-containing (meth)acrylate, (meth)acrylic acid, vinyl acetate, or acrylic monomers modified therefrom. A suitable polymerization method may be used. The acryl resin may have a weight average molecular weight of, e.g., 10,000 g/mol to 200,000 g/mol.

Polyester Urethane Resin

As used herein, the polyester urethane resin may be a resin prepared through reaction of a polyester polyol and a diisocyanate.

The polyester polyol refers to a polymer having a plurality of ester groups and a plurality of hydroxyl groups. The polyester polyol may be obtained through condensation of dicarboxylic acid and a diol.

Examples of the dicarboxylic acid may include aliphatic or aromatic dicarboxylic acid, such as phthalic acid, terephthalic acid, isophthalic acid, adipic acid, sebacic acid, succinic acid, glutaric acid, suberic acid, azelaic acid, dodecanedicarboxylic acid, hexahydrophthalic acid, tetrachlorophthalic acid, 1,5-naphthalenedicarboxylic acid, fumaric acid, maleic acid, itaconic acid, citraconic acid, mesaconic acid, and tetrahydrophthalic acid.

Examples of the diol may include glycols, such as ethylene glycol, propylene glycol, hexanediol, neopentyl glycol, diethylene glycol, triethylene glycol, 1,3-propanediol, 1,3-butanediol, 1,4-butanediol, 1,5-pentanediol, 1,6-hexanediol, dipropylene glycol, dibutylene glycol, 2-methyl-1,3-pentanediol, 2,2,4-trimethyl-1,3-pentanediol, and 1,4-cyclohexanedimethanol.

Examples of the diisocyanate may include aromatic, alicyclic or aliphatic diisocyanates, such as isophorone diisocyanate (IPDI), 4,4'-diphenylmethane diisocyanate (MDI), 1,6-hexamethylene diisocyanate (HDI), xylene diisocyanate, hydrogenated diphenylmethane diisocyanate, naphthalene diisocyanate, 2,4-toluene diisocyanate, and 2,6-toluene diisocyanate.

The polyester urethane resin may have a weight average molecular weight of, e.g., 10,000 g/mol to 200,000 g/mol or 50,000 g/mol to 100,000 g/mol.

The binder resins may be used alone or in combination of two or more binder resins having different weight average molecular weights. When two or more binder resins having different weight average molecular weights are used, it is possible to help prevent a problem of excessive film hardening which may otherwise occur in the case of using only a binder having a high weight average molecular weight and/or a difficulty in film formation which may otherwise occur in the case of using only a binder having a low weight average molecular weight. In addition, as compared with the case where a binder having a middle weight average molecular weight is used alone, the anisotropic conductive film composition according to an embodiment may form an anisotropic conductive film having excellent properties through mutual supplementation between the binder resins having different weight average molecular weights.

In an implementation, the binder resin may be a resin composition, an may include the acrylonitrile-butadiene rubber resin, the polyurethane resin, and the acryl resin.

In an implementation, the resin composition may include, e.g., 1% by weight (wt %) to 10 wt % of the acrylonitrile-butadiene rubber resin, 20 wt % to 40 wt % of the polyurethane resin, and 10 wt % to 30 wt % of the acryl resin. Within these content ranges of the components, the resin composition can may provide excellent film formability and adhesion.

In an implementation, the binder resin may be present in an amount of, e.g., 30 wt % to 80 wt %, 40 wt % to 70 wt %, or 50 wt % to 70 wt %, based on a total weight of the anisotropic conductive film in terms of solid content. Within this range, the binder resin may provide excellent film formability and adhesion.

b) Radical Polymerization Material

In the embodiment, the radical polymerization materials may include a first radical polymerization material (having one or two (meth)acrylate reactive groups in a structure thereof) and a second radical polymerization material (having at least three (meth)acrylate reactive groups in a structure thereof).

Examples of the first radical polymerization material may include methyl (meth)acrylate, ethyl (meth)acrylate, n-butyl (meth)acrylate, isobutyl (meth)acrylate, t-butyl (meth)acrylate, 2-ethylhexyl (meth)acrylate, isodecyl (meth)acrylate, lauryl (meth)acrylate, $C_{12}$-$C_{15}$ alkyl (meth)acrylate, n-stearyl (meth)acrylate, n-butoxyethyl (meth)acrylate, butoxydiethylene glycol (meth)acrylate, methoxytriethylene glycol (meth)acrylate, methoxypolyethylene glycol (meth)acrylate, cyclohexyl (meth)acrylate, tetrahydrofurfuryl (meth)acrylate, benzyl (meth)acrylate, 2-phenoxyethyl (meth)acrylate, isobornyl (meth)acrylate, 2-hydroxyethyl (meth)acrylate, 2-hydroxypropyl (meth)acrylate, 2-hydroxybutyl (meth) acrylate, 4-hydroxybutyl (meth)acrylate, dimethylaminoethyl (meth)acrylate, diethylaminoethyl (meth)acrylate, (meth) acrylic acid, 2-(meth)acryloyloxyethyl succinic acid, 2-(meth)acryloyloxyethylhexahydrophthalate, 2-(meth) acryloyloxyethyl-2-hydroxypropylphthalate, glycidyl (meth)acrylate, 2-(meth)acryloyloxyethyl acid phosphate, ethylene glycol di(meth)acrylate, diethylene glycol di(meth) acrylate, triethylene glycol di(meth)acrylate, 1,4-butanediol di(meth)acrylate, neopentyl glycol di(meth)acrylate, 1,6-hexanediol di(meth)acrylate, 1,9-nonanediol di(meth)acrylate, 1,10-decanediol di(meth)acrylate, glycerin di(meth) acrylate, 2-hydroxy-3-acryloyloxypropyl (meth)acrylate, dimethylol tricyclodecane di(meth)acrylate, trifluoroethyl (meth)acrylate, perfluorooctylethyl (meth)acrylate, isoamyl acrylate, di(meth)acrylates of ethylene oxide adducts of bisphenol A, di(meth)acrylates of propyleneoxide adducts of bisphenol A, trimethylolpropane-benzoate-(meth)acrylate, bisphenol A diglycidyl di(meth)acrylate, and adducts of toluene diisocyanate and 2-hydroxy-3-phenoxypropyl (meth) acrylate. These may be used alone or in combination thereof.

In an implementation, the first radical polymerization material may be present in an amount of, e.g., 5 wt % to 40 wt %, 7 wt % to 40 wt %, or 10 wt % to 40 wt %, based on the total weight of the anisotropic conductive film in terms of solid content. Within this range, the first radical polymerization material may permit the entirety of a cured product to form a sufficient acrylate curing structure and may help prevent an excessive increase in hardness of the cured product and deterioration in peel strength and adhesion.

Examples of the second radical polymerization material may include trimethylol propane tri(meth)acrylate, tri(meth) acrylate of ethylene oxide modified trimethylol propane, pentaerythritol tri(meth)acrylate, pentaerythritol tetra(meth) acrylate, dipentaerythritol hexa(meth)acrylate, adducts of pentaerythritol tri(meth)acrylate and hexamethylene diisocyanate, adducts of pentaerythritol tri(meth)acrylate and toluene diisocyanate, adducts of pentaerythritol tri(meth)acrylate and isophorone diisocyanate, and adducts of dipentaerythritol penta(meth)acrylate and hexamethylene diisocyanate. These may be used alone or in combination thereof.

In an implementation, the second radical polymerization material may be present in an amount of, e.g., 1 wt % to 20 wt %, 1 wt % to 15 wt %, or 1 wt % to 10 wt %, based on the total weight of the anisotropic conductive film in terms of solid content. Within this range, the second radical polymerization material may sufficiently increase curing rate and may provide high reliability through a three-dimensional curing structure. In addition, within this range, the second radical polymerization material may help prevent excessive increase in hardness of a cured product, deterioration in peel strength and adhesion, and deterioration in storage stability due to excessive increase in reactivity of the composition.

In an implementation, the radical polymerization materials may be present (e.g., together) in a total amount of, e.g., 6 wt % to 60 wt %, 10 wt % to 50 wt %, or 20 wt % to 40 wt %, based on the total weight of the anisotropic conductive film in terms of solid content. Within this range, the radical polymerization materials may permit the entirety of a cured product to form a sufficient acrylate curing structure and may help prevent excessive increase in hardness of the cured product and deterioration in peel strength and adhesion.

In an implementation, the first radical polymerization material and the second radical polymerization material may be mixed in a weight ratio (first radical polymerization material/second radical polymerization material) of, e.g., 1 to 10, 1 to 7, 1 to 5, or 2 to 4.

Within this range of the weight ratio of the first radical polymerization material to the second radical polymerization material, the radical polymerization materials may form a dense net-shaped crosslinking with the binders instead of a linear shape, thereby providing low moisture permeability and low moisture absorbency, while maintaining excellent reliability in terms of connection resistance, adhesion, bubbling properties, and the like.

c) Conductive Particles

Suitable conductive particles may be used. Examples of the conductive particles may include metal particles such as gold (Au), silver (Ag), nickel (Ni), copper (Cu), and solder particles; carbon particles; resin particles, such as polyethylene, polypropylene, polyester, polystyrene, polyvinyl alcohol and modified resin particles thereof plated with metals, such as gold (Au), silver (Ag), nickel (Ni), and the like; and insulated conductive particles obtained by further coating insulating particles on the metal-coated polymer resin particles. These may be used alone or in combination thereof.

The conductive particles may have various average particle diameters depending on pitches of circuits. In an implementation, the average particle diameter of the conductive particles may be selected in the range of, e.g., 1 μm to 30 μm, as desired.

In an implementation, the conductive particles may be present in an amount of 0.1 wt % to 30 wt %, 1 wt % to 20 wt %, or 1 wt % to 10 wt %, based on the total weight of the anisotropic conductive film in terms of solid content. Within this content range, the anisotropic conductive film may exhibit excellent bonding characteristics by reducing and/or preventing failure in bonding and/or isolation.

Inorganic Particles

In an implementation, the anisotropic conductive film may further include inorganic particles in addition to the a), b) and c) components. When further included in the composition for the anisotropic conductive film, the inorganic particles may help uniformly distribute pressure upon compression of the anisotropic conductive film to electrodes, and may help reduce moisture permeability and moisture absorbency of the anisotropic conductive film while improving adhesion and connection reliability.

Examples of the inorganic particles may include at least one type of ceramic particles selected from among silica, $Al_2O_3$, $TiO_2$, ZnO, MgO, $ZrO_2$, PbO, $Bi_2O_3$, $MoO_3$, $V_2O_5$, $Nb_2O_5$, $Ta_2O_5$, $WO_3$, and $In_2O_3$.

The silica particles may have an average particle diameter of, e.g., 0.01 μm to 10 μm, 0.05 μm to 5 μm, or 0.1 μm to 1 μm.

The silica particles may be present in an amount of, e.g., 0.1 wt % to 20 wt % or 0.1 wt % to 10 wt %, based on the total weight of the anisotropic conductive film in terms of solid content. Within this range, the inorganic particles may help uniformly distribute pressure applied to the electrodes and may help reduce moisture permeability and moisture absorbency of the anisotropic conductive film while improving adhesion and connection reliability.

Curing Initiator

The anisotropic conductive film may further include a curing initiator. A suitable curing initiator may be used. Examples of the curing initiator may include peroxides (organic peroxides) and azo-based initiators.

Examples of the peroxide-based initiator may include acetylacetone peroxide, methylcyclohexanone peroxide, methylethylketone peroxide, 1,1-bis(t-butylperoxy)cyclohexane, 1,1-bis(t-butylperoxy)-2-methylcyclohexane, 1,1-bis(t-butylperoxy) -3,3,5-trimethylcyclohexane, n-butyl-4,4-bis(t-butylperoxy)valerate, 2,2-bis(t-butylperoxy)butane, t-butylhydroperoxide, p-menthane hydroperoxide, 1,1,3,3-tetramethylbutylhydroperoxide, α',α'-bis(t-butylperoxy)diisopropylbenzene, 2,5-dimethyl-2,5-bis(t-butylperoxy)hexane, 2,5-dimethyl-2,5-bis(t-butylperoxy)hexine-3, benzoyl peroxide, lauryl peroxide, stearoyl peroxide, succinic acid peroxide, 3,5,5-trimethylhexanoyl peroxide, di-2-ethoxyethyl peroxy dicarbonate, diisopropyl peroxy carbonate, di-3-methoxybutyl peroxy dicarbonate, di-2-ethylhexyl peroxy dicarbonate, bis(4-t-butylcyclohexyl)peroxy dicarbonate, t-butyl peroxy acetate, t-butyl peroxy-2-ethylhexyl monocarbonate, t-butyl peroxy isopropyl monocarbonate, t-butyl peroxy laurate, t-butyl peroxy maleic acid, t-butyl peroxy neodecanoate, t-butyl peroxy-2-ethylhexanoate, t-butyl peroxy pivalate, t-butyl peroxy benzoate, t-butyl peroxy-m-toluate/benzoate, t-butyl peroxy-3,3,5-trimethylhexanoate, α',α'-bis(neodecanoylperoxy)diisopropylbenzene, cumyl peroxy neodecanoate, 1-cyclohexyl-1-methylethyl peroxy neodecanoate, 2,5-dimethyl-2,5-bis(m-toluoylperoxy)hexane(2,5-dimethyl-2,5-bis(m-toluoylperoxy)hexane), 2,5-dimethyl-2,5-bis(2-ethylhexanoylperoxy)hexane, 2,5-dimethyl-2,5-bis(benzoylperoxy)hexane, t-hexyl peroxy isopropyl monocarbonate, t-hexyl peroxy neodecanoate, t-hexyl peroxy-2-ethylhexanoate, t-hexyl peroxy pivalate, 1,1,3,3-tetramethylbutyl peroxy-2-ethylhexanoate, and 3,3',4,4'-tetra(t-butyl peroxy carbonyl)benzophenone. These may be used alone or in combination thereof.

Examples of the azo-based initiator may include 2,2'-azobis(4-methoxy-2,4-dimethyl valeronitrile), dimethyl 2,2'-azobis(2-methyl propionate), and 2,2'-azobis(N-cyclohexyl -2-methyl propionate). These may be used alone or in combination thereof.

In an implementation, the curing initiator may be present in an amount of, e.g., 0.1 wt % to 20 wt %, 0.1 wt % to 15 wt %, or 1 wt % to 10 wt %, based on the total weight of the anisotropic conductive film in terms of solid content. Within this content range, the composition may be sufficiently cured in a short time and may have good compatibility, thereby allowing efficient formation of the anisotropic conductive film.

In an implementation, the anisotropic conductive film may further include additives, e.g., polymerization inhibitors, anti-oxidants, heat stabilizers, curing accelerators, coupling agents, or the like, in order to help provide additional properties to the film without deteriorating fundamental properties of the film. The amounts of these additives added may be determined in various ways according to the purpose and desired effects of the film.

A method of preparing the anisotropic conductive film according to the embodiments may include a suitable method. No special apparatus or equipment is required to form the anisotropic conductive film. For example, the anisotropic conductive film may be prepared by dissolving a binder resin in an organic solvent, adding other components for the anisotropic conductive film, stirring the mixture for a certain period of time at a rate that does not cause pulverization of the conductive particles, applying the mixture to an suitable thickness, e.g., 10 μm to 50 μm, to a release film, and drying the mixture for a sufficient time to vaporize the organic solvent. As a result, the anisotropic conductive film may include an anisotropic conductive film and a release film.

The anisotropic conductive film according to an embodiment may have a moisture permeability of, e.g., 170 g/m$^2$/24 hr or less, 160 g/m$^2$/24 hr or less, or 150 g/m$^2$/24 hr or less. Within this range, the anisotropic conductive film may exhibit excellent reliability in terms of adhesion, connection resistance, or the like, even after use under high temperature and/or high humidity for a long period of time.

The moisture permeability may be measured by a suitable method. For example, an anisotropic conductive film may be cut into a sample having a diameter of 5 cm and a thickness of 200 μm, and cured at 200° C. for 1 hour. Then, with the cured sample may be placed at an inlet of a bottle containing 20 g of calcium chloride, the bottle may be sealed and an initial weight of the bottle may be measured and recorded. Then, the bottle may be left at 85° C. and 85% RH (relative humidity) for 24 hours and moisture may be removed from the surface of the sample, followed by measuring the weight of the bottle. Finally, a weight increment may be recorded.

The anisotropic conductive film according to an embodiment may have a moisture absorbency of, e.g., 2% or less, 1.5% or less, or 1.2% or less. Within this range, the anisotropic conductive film may exhibit excellent reliability in terms of adhesion, connection resistance, bubbling properties, or the like, even after use under high temperature and/or high humidity for a long period of time.

The moisture absorbency may be measured by a suitable method. For example, an anisotropic conductive film may be cut into a sample having a size of 2 cm×2 cm×200 μm (length, width, thickness) and cured at 200° C. for 1 hour, followed by measuring an initial weight of the sample. Then, the sample may be left at 85° C. and 85% RH for 24 hours and moisture may be removed from the surface of the sample, followed by measuring the weight of the sample. Finally, a weight increment may be recorded.

In an implementation, the anisotropic conductive film may have a reliability adhesive strength of, e.g., 400 gf/cm or more, 450 gf/cm or more, 500 gf/cm or more, or 530 gf/cm or more. The reliability adhesive strength refers to adhesive strength measured after being subjected to pre-compression and primary compression and left at 85° C. and 85% RH for 500 hours, with a release film removed therefrom.

Pre-compression may be performed under conditions of 60° C. to 80° C. at 1.0 MPa to 4.0 MPa for 1 second to 3 seconds, and primary compression may be performed under conditions of 170° C. to 200° C. at 2.5 MPa to 7 MPa for 1 second to 7 seconds.

For example, the reliability adhesive strength may be measured by the following method: the prepared anisotropic conductive film may be left at room temperature (25° C.) for 1 hour, and a plurality of specimens may be prepared using metal electrode glass (Mo/Al/Mo structure, Samsung Electronics Co., Ltd.) and COF (Samsung Electronics Co., Ltd.) through pre-compression under conditions of a measured temperature of about 70° C. at 1 MPa for 1 second, followed by primary compression at 185° C. at 4.5 MPa for 4 seconds, with a release film removed from the anisotropic conductive film. Each of the specimens may be left at 85° C. and 85% RH for 500 hours, followed by measuring an average peel strength at a peel angle of 90° and a peel rate of 50 min/min using a peel strength tester H5KT (Tinius Olsen).

In an implementation, the anisotropic conductive film may have a reliability connection resistance of, e.g., 3Ω or less or 2.6Ω or less. The reliability connection resistance refers to connection resistance measured after being subjected to pre-compression and primary compression and left at 85° C. and 85% RH for 500 hours, with a release film removed therefrom. Within this range, the anisotropic conductive film may have low resistance even after use under conditions of high temperature and/or high humidity for a long period of time, thereby providing excellent reliability.

For example, the reliability connection resistance strength may be measured by the following method: the prepared anisotropic conductive films may be left at room temperature (25° C.) for 1 hour, and 10 specimens of each of the anisotropic conductive films may be prepared by connecting the anisotropic conductive film to COF (Samsung Electronics Co., Ltd.) prepared by forming a pattern, which allows 4-probe measurement, on a 0.5 t pattern-free glass plate coated with a 1,000 Å thick ITO layer, through pre-compression under conditions of a measured temperature of 70° C., 1 second and 1 MPa and primary compression under conditions of 185° C., 4 seconds and 4.5 MPa, with a release film removed from the anisotropic conductive film. After the 10 specimens of each anisotropic conductive film are left at 85° C. and 85% RH for 500 hours to evaluate reliability under high temperature and high humidity conditions, reliability connection resistance of each of the specimens may be measured (in accordance with ASTM D117) and an average value may be calculated.

In an implementation, the anisotropic conductive film may have a reliability bubbling area of, e.g., 20% or less or 15% or less. The reliability bubbling area refers to a bubbling area measured after being subjected to pre-compression and primary compression and left at 85° C. and 85% RH for 500 hours, with a release film removed therefrom. Within this range, the anisotropic conductive film may have a narrow or small bubbling area, even after use under conditions of high temperature and/or high humidity for a long period of time, thereby providing excellent adhesion and reliability.

For example, the reliability bubbling area may be measured by the following method: the prepared anisotropic conductive film may be left at room temperature (25° C.) for 1 hour and a plurality of specimens may be prepared using metal electrode glass (Mo/Al/Mo structure, Samsung Electronics Co., Ltd.) and COF (Samsung Electronics Co., Ltd.) through pre-compression under conditions of a measured temperature of 70° C. at 1 MPa for 1 second, followed by primary compression at 185° C. at 4.5 MPa for 4 seconds, with a release film removed from the anisotropic conductive film.

The 10 specimens of each of the anisotropic conductive films may be left at 85° C. and 85% RH for 500 hours to evaluate reliability under high temperature and high humidity conditions, and 10 points of each specimen may be photographed using an optical microscope. Then, a ratio of a bubble area to an area of a space between electrodes may be measured using an image analyzer, and an average value may be calculated.

According to another embodiment, a semiconductor device may include: a first connecting member having a first electrode; a second connecting member having a second electrode; and the anisotropic conductive film according to an embodiment between the first and second connecting members and electrically connecting the first and second electrodes to each other.

FIG. 1 illustrates a semiconductor device that includes a first connecting member 50 having a first electrode 70 and a second connecting member 60 having a second electrode 80. The first and second connecting members 50, 60 may be bonded to each other via an anisotropic conductive film in accordance with an embodiment. When the anisotropic conductive film 10 is compressed between the first connecting member 50 (including the first electrode 70) and the second connecting member 60 (including the second electrode 80), the first electrode 70 may be electrically connected to the second electrode 80 via conductive particles 40.

For example, the semiconductor device according to the embodiment may include the first connecting member 50 (having a first electrode 70); the second connecting member 60 (having a second electrode 80); and the anisotropic conductive film 10 including conductive particles 40. When the anisotropic conductive film 10 placed between the first connecting member 50 having the first electrode 70 and the second connecting member 60 having the second electrode 80 is compressed, the first electrode 70 and the second electrode 80 may be connected to each other via the conductive particles 40. In this embodiment, the first and second connecting members 50, 60 may have similar structures in terms of material, thickness, size and interconnectivity. In an implementation, the first and second connecting members may have a thickness of, e.g., about 20 μm to about 100 μm.

In an implementation, the first and second connecting members may have different structures and functions in terms of material, thickness, size and interconnectivity. The first connecting member or the second connecting member may be formed of, e.g., glass, PCB (Printed Circuit Board), fPCB, COF, TCP, ITO glass, or the like. The first electrode or the second electrode may be a protruding electrode or a flat electrode. When the first and second electrodes are protruding electrodes, these electrodes may have, e.g., a height (H) of about 2.50 μm to about 10 μm, a width (W) of about 50 μm to about 100 μm, and an inter-electrode gap (G) of about 50 μm to about 110 μm. In an implementation, the electrodes may have, e.g., a height (H) of about 2.50 μm to about 9 μm, a width (W) of about 50 μm to about 100 μm, and an inter-electrode gap (G) of about 60 μm to about 100 μm.

When the first and second electrodes are flat electrodes, these electrodes may have, e.g., a thickness of about 500 Å to about 1,200 Å, and may be formed of, e.g., ITO, copper, silicon, IZO, and the like.

The flat electrode may have, e.g., a thickness from 800 Å to 1,200 Å, and the protruding electrode may have, e.g., a height from 6 μm to 10 μm. Here, when an insulation layer has a thickness from 4 μm to 12 μm, sufficient adhesion can be secured. In an implementation, the flat electrode may have, e.g., a thickness of 1,000 Å, and the protruding electrode may have, e.g., a height of 8 μm. Here, the insulation layer may have a thickness from 6 μm to 10 μm.

A suitable method may be used to form the semiconductor device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLE 1

5 wt % of an acrylonitrile-butadiene rubber resin (N-34, Nippon Zeon), 35 wt % of a polyurethane resin (NPC7007T, Nanux), 20 wt % of an acryl resin (AOF-7003, Aekyung Chemical), 13 wt % of 4-hydroxybutyl acrylate, 13 wt % of dimethylol tricyclodecane diacrylate, 8 wt % of pentaerythritol triacrylate, 3 wt % of conductive particles (average particle diameter of 3 μm, Sekisui), and 3 wt % of lauryl peroxide were mixed to prepare a composition for an anisotropic conductive film.

The composition was stirred at room temperature (25° C.) for 60 minutes at a stirring rate at which the conductive particles are not pulverized. A 35 μm thick film was formed on a silicone release surface-treated polyethylene base film using the composition, and a casting knife was used for film formation. The film was dried at 60° C. for 5 minutes.

EXAMPLE 2

An anisotropic conductive film was prepared in the same manner as in Example 1, except that 10 wt % of 4-hydroxybutyl acrylate, 10 wt % of dimethyloltricyclodecane diacrylate and 9 wt % of pentaerythritol triacrylate were used, and 5 wt % of silica particles (0.5 μm, Denka) was additionally used.

EXAMPLE 3

An anisotropic conductive film was prepared in the same manner as in Example 1, except that 26 wt % of dimethyloltricyclodecane diacrylate was used, and 4-hydroxybutylacrylate was omitted.

COMPARATIVE EXAMPLE 1

An anisotropic conductive film was prepared in the same manner as in Example 1, except that 9 wt % of 4-hydroxybutyl acrylate was used, 25 wt % of silica particles (0.5 μm, Denka) was included, and dimethyloltricyclodecane diacrylate and pentaerythritol triacrylate were omitted.

COMPARATIVE EXAMPLE 2

An anisotropic conductive film was prepared in the same manner as in Example 1, except that 17 wt % of 4-hydroxybutyl acrylate and 17 wt % of dimethyloltricyclodecane diacrylate were used, and pentaerythritol triacrylate was omitted.

COMPARATIVE EXAMPLE 3

An anisotropic conductive film was prepared in the same manner as in Example 1, except that 7 wt % of 4-hydroxybutyl acrylate, 7 wt % of dimethyloltricyclodecane diacrylate, and 20 wt % of pentaerythritol triacrylate were used.

COMPARATIVE EXAMPLE 4

An anisotropic conductive film was prepared in the same manner as in Example 1, except that 16 wt % of 4-hydroxybutyl acrylate, 16 wt % of dimethyloltricyclodecane diacrylate, and 2 wt % of pentaerythritoltriacrylate were used.

The compositions of the anisotropic conductive films prepared in Examples 1 to 3 and Comparative Examples 1 to 4 are shown in Table 1, below.

TABLE 1

| Composition (wt %) | | E 1 | E 2 | E 3 | CE 1 | CE 2 | CE 3 | CE 4 |
| --- | --- | --- | --- | --- | --- | --- | --- | --- |
| Binder resin | NBR | 5 | 5 | 5 | 5 | 5 | 5 | 5 |
| | Polyurethane resin | 35 | 35 | 35 | 35 | 35 | 35 | 35 |
| | Acryl resin | 20 | 20 | 20 | 20 | 20 | 20 | 20 |
| First radical polymerization material | One reaction group: 4-hydroxybutyl acrylate | 13 | 10 | — | 9 | 17 | 7 | 16 |
| | Two reaction groups: dimethyloltricyclodecane diacrylate | 13 | 10 | 26 | — | 17 | 7 | 16 |
| Second radical polymerization material | Three reaction groups: pentaerythritol triacrylate | 8 | 9 | 8 | — | — | 20 | 2 |
| Inorganic particles | | — | 5 | — | 25 | — | — | — |
| Conductive particles | | 3 | 3 | 3 | 3 | 3 | 3 | 3 |
| Curing initiator | | 3 | 3 | 3 | 3 | 3 | 3 | 3 |
| First radical polymerization material/second radical polymerization material (Weight ratio) | | 3.25 | 2.22 | 3.25 | — | — | 0.7 | 16 |

EXPERIMENTAL EXAMPLE 1

Measurement of Moisture Permeability

Moisture permeability of each of the anisotropic conductive films prepared in Example 1 to 3 and Comparative Example 1 to 4 was measured as follows.

Each of the anisotropic conductive films was cut into a sample having a diameter of 5 cm and a thickness of 200 μm, and cured at 200° C. for 1 hour. Thereafter, with the cured sample placed at an inlet of a bottle containing 20 g of calcium chloride, the bottle was sealed and an initial weight of the bottle was measured and recorded.

Thereafter, the bottle was left at 85° C. and 85% RH for 24 hours and moisture was removed from the surface of the sample, followed by measuring the weight of the bottle. Finally, a weight increment was recorded.

EXPERIMENTAL EXAMPLE 2

Measurement of Moisture Absorbency

Moisture absorbency of each of the anisotropic conductive films prepared in Example 1 to 3 and Comparative Example 1 to 4 was measured as follows.

Each of the anisotropic conductive films was cut into a sample having a size of 2 cm×2 cm×200 μm (length, width, thickness) and cured at 200° C. for 1 hour, followed by measuring an initial weight of the sample.

Thereafter, the sample was left at 85° C. and 85% RH for 24 hours and moisture was removed from the surface of the sample, followed by measuring the weight of the sample. Finally, a weight increment was recorded.

EXPERIMENTAL EXAMPLE 3

Measurement of Reliability Connection Resistance

Reliability connection resistance of anisotropic conductive films prepared in Example 1 to 3 and Comparative Example 1 to 4 was measured as follows.

Each of the anisotropic conductive films was left at room temperature (25° C.) for 1 hour, and 10 specimens of each anisotropic conductive film were prepared by connecting the anisotropic conductive film to COF (Samsung Electronics Co., Ltd.) prepared by forming a pattern, which allows 4-probe measurement, on a 0.5 t pattern-free glass plate coated with a 1,000 Å thick ITO layer, through pre-compression under conditions of a measured temperature of 70° C., 1 second and 1 MPa and primary compression under conditions of 185° C., 4 seconds and 4.5 MPa, with a release film removed from the anisotropic conductive film.

After the 10 specimens of each anisotropic conductive film were left at 85° C. and 85% RH for 500 hours to evaluate reliability under high temperature and high humidity conditions, reliability connection resistance of each of the specimens was measured (in accordance with ASTM D117), and an average value was calculated.

EXPERIMENTAL EXAMPLE 4

Measurement of Reliability Adhesive Strength

Reliability adhesive strength of an each anisotropic conductive films prepared in Example 1 to 3 and Comparative Example 1 to 4 was measured as follows.

Each of the anisotropic conductive films was left at room temperature (25° C.) for 1 hour, and 10 specimens of each anisotropic conductive film were prepared using metal electrode glass (Mo/Al/Mo structure, Samsung Electronics Co., Ltd.) and COF (Samsung Electronics Co., Ltd.) through pre-compression under conditions of a measured temperature of 70° C. at 1 MPa for 1 second, followed by primary compression at 185° C. at 4.5 MPa for 4 seconds, with a release film removed from the anisotropic conductive film.

Each of the 10 specimens was left at 85° C. and 85% RH for 500 hours to evaluate reliability under high temperature and high humidity conditions, followed by measuring an average peel strength at a peel angle of 90° and a peel rate of 50 mm/min using a peel strength tester H5KT (Tinius Olsen).

EXPERIMENTAL EXAMPLE 5

Measurement of Reliability Bubbling Area

Reliability bubbling area of an each of the anisotropic conductive films prepared in Example 1 to 3 and Comparative Example 1 to 4 was measured as follows.

Each of the anisotropic conductive films was left at room temperature (25° C.) for 1 hour, and 10 specimens of each of the anisotropic conductive films were prepared using metal electrode glass (Mo/Al/Mo structure, Samsung Electronics Co., Ltd.) and COF (Samsung Electronics Co., Ltd.) through pre-compression under conditions of a measured temperature of 70° C. at 1 MPa for 1 second, followed by primary compression at 185° C. at 4.5 MPa for 4 seconds, with a release film removed from the anisotropic conductive film.

The 10 specimens of each anisotropic conductive film were left at 85° C. and 85% RH for 500 hours to evaluate reliability under high temperature and high humidity conditions, and 10 points of each specimen were photographed using an optical microscope. Thereafter, a ratio of a bubble area to an area of a space between electrodes was measured using an image analyzer and an average value calculated.

Measurement results in Experimental Example 1 to 5 are shown in Table 2, below.

TABLE 2

| Properties | E 1 | E 2 | E 3 | CE 1 | CE 2 | CE 3 | CE 4 |
|---|---|---|---|---|---|---|---|
| Moisture permeability (g/m$^2$/24 hr) | 130 | 110 | 140 | 130 | 260 | 220 | 210 |
| Moisture absorbency (%) | 1.2 | 0.9 | 1.2 | 1.1 | 2.3 | 2.2 | 2.2 |
| Reliability connection resistance ($\Omega$) | 2.4 | 2.3 | 2.4 | 2.8 | 3.8 | 2.7 | 3.4 |
| Reliability adhesive strength (gf/cm) | 550 | 550 | 540 | 320 | 350 | 390 | 360 |
| Reliability bubbling area (%) | 10 | 12 | 10 | 35 | 22 | 19 | 20 |

By way of summation and review, an anisotropic conductive film having excellent long-term reliability, which can overcome problems due to continuous current flow and exposure to high temperature and high humidity conditions in use of products may be desirable. For example, with recent development of light, thin, short and small IT devices and increase in resolution of flat panel displays, circuit widths of devices may be narrowed, and thus the number of conductive particles placed between electrodes to connect the circuits may be decreased, thereby increasing importance of long-term reliability.

In order to enhance long-term reliability of an anisotropic conductive film, inorganic particles may be added to a composition for anisotropic conductive films. In this case, the inorganic particles may help reduce moisture permeability and moisture absorbency of the films. The inorganic particles may deteriorate inherent adhesion of the anisotropic conductive film to cause severe bubbling at an interface between the film and a substrate, thereby deteriorating long-term reliability.

The embodiments provide an anisotropic conductive film having excellent long-term reliability through adjustment of moisture permeability and moisture absorbency of the film without deteriorating adhesion of an anisotropic conductive film.

The embodiments may provide semiconductor devices connected by an anisotropic conductive film, which is prepared using at least two types of radical polymerization materials having different numbers of reaction groups in structures thereof to provide low moisture permeability and low moisture absorbency while exhibiting excellent long-term reliability.

The embodiments may provide a semiconductor device connected by an anisotropic conductive film, which is prepared using radical polymerization materials including a material having one or two (meth)acrylate reaction groups in a structure thereof and a material having at least three (meth)acrylate reaction groups in a structure thereof to improve long-term reliability.

The embodiments may provide a semiconductor device connected by an anisotropic conductive film, which is prepared using at least two types of radical polymerization materials having different numbers of reaction groups in structures thereof to provide low moisture permeability and low moisture absorbency while exhibiting excellent long-term reliability.

An anisotropic conductive film used to connect a semiconductor device according to an embodiment may have low moisture permeability and low moisture absorbency and thus may exhibit excellent reliability in term of reliability connection resistance, reliability adhesive strength or reliability bubbling properties even after use under conditions of high temperature and/or high humidity for a long period of time.

As an element of a circuit, a semiconductor device prepared using the anisotropic conductive film may provide semiconductor effects for a long period of time due to excellent properties of the anisotropic conductive film.

The embodiments provide an anisotropic conductive film having low moisture permeability and moisture absorbency while exhibiting excellent long-term reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device connected by an anisotropic conductive film, the anisotropic conductive film comprising:
   a binder resin;
   a first radical polymerization material having one or two (meth)acrylate reactive groups in a structure thereof and a second radical polymerization material having at least three (meth)acrylate reactive groups in a structure thereof; and
   conductive particles,
   the anisotropic conductive film having a moisture permeability of 170 g/m$^2$/24 hr or less and a moisture absorbency of 2% or less,
   wherein the anisotropic conductive film has a reliability connection resistance of 3Ω or less, as measured after being subjected to pre-compression under conditions of 60° C. to 80° C. at 1.0 MPa to 4.0 MPa for 1 second to 3 seconds and primary compression under conditions of 170° C. to 200° C. at 2.5 MPa to 7 MPa for 1 second to 7 seconds with a release film removed from the pre-compressed anisotropic conductive film, and being left at a temperature of 85° C. and a relative humidity of 85% for 500 hours.

2. The semiconductor device as claimed in claim 1, wherein the anisotropic conductive film has a reliability adhesive strength of 400 gf/cm or more, as measured after being subjected to pre-compression under conditions of 60° C. to 80° C. at 1.0 MPa to 4.0 MPa for 1 second to 3 seconds and primary compression under conditions of 170° C. to 200° C. at 2.5 MPa to 7 MPa for 1 second to 7 seconds with a release film removed from the pre-compressed anisotropic conductive film, and being left at a temperature of 85° C. and a relative humidity of 85% for 500 hours.

3. The semiconductor device as claimed in claim 1, wherein the anisotropic conductive film has a reliability bubbling area of 20% or less, as measured after being subjected to pre-compression under conditions of 60° C. to 80° C. at 1.0 MPa to 4.0 MPa for 1 second to 3 seconds and primary compression under conditions of 170° C. to 200° C. at 2.5 MPa to 7 MPa for 1 second to 7 seconds with a release film removed from the pre-compressed anisotropic conductive film, and being left at a temperature of 85° C. and a relative humidity of 85% for 500 hours.

4. The semiconductor device as claimed in claim 1, wherein the anisotropic conductive film includes:
   30 wt % to 80 wt % of the binder resin;
   6 wt % to 60 wt % of the radical polymerization materials; and
   0.1 wt % to 20 wt % of the conductive particles, all in terms of solid content.

5. The semiconductor device as claimed in claim 1, wherein a weight ratio of the first radical polymerization material to the second radical polymerization material (first radical polymerization material/second radical polymerization material) ranges from 1 to 10.

6. The semiconductor device as claimed in claim 1, wherein the binder resin includes at least two types of resins having different weight average molecular weights.

7. The semiconductor device as claimed in claim 6, wherein the binder resin includes at least two types of resins selected from the group of acrylonitrile-butadiene rubber resins, polyurethane resins, or acryl resins.

8. The semiconductor device as claimed in claim 1, wherein the first radical polymerization material includes at least one selected from the group of hydroxybutyl (meth)acrylate, methyl (meth)acrylate, ethyl (meth)acrylate, n-butyl (meth)acrylate, isobutyl (meth)acrylate, 2-hydroxypropyl (meth)acrylate, or glycidyl (meth)acrylate.

9. The semiconductor device as claimed in claim 1, wherein the second radical polymerization material includes at least one selected from the group of pentaerythritol tri(meth)acrylate, trimethylolpropane tri(meth)acrylate, tri(meth)acrylate of ethylene oxide-modified trimethylolpropane, pentaerythritol tetra(meth)acrylate, or dipentaerythritol hexa(meth)acrylate.

10. The semiconductor device as claimed in claim 1, wherein the anisotropic conductive film further includes inorganic particles.

11. The semiconductor device as claimed in claim 10, wherein the inorganic particles are present in an amount of 0.1 wt % to 20 wt %, based on a total weight of the anisotropic conductive film in terms of solid content.

12. A semiconductor device, comprising:
   a first connecting member including a first electrode;
   a second connecting member including a second electrode; and
   an anisotropic conductive film between the first connecting member and the second connecting member and bonding the first electrode to the second electrode, the anisotropic conductive film including:

a binder resin;
a first radical polymerization material having one or two (meth)acrylate reactive groups in a structure thereof and a second radical polymerization material having at least three (meth)acrylate reactive groups in a structure thereof; and
conductive particles,
the anisotropic conductive film having a moisture permeability of 170 g/m²/24 hr or less and a moisture absorbency of 2% or less,
wherein the anisotropic conductive film has a reliability connection resistance of 3Ω or less, as measured after being subjected to pre-compression under conditions of 60° C. to 80° C. at 1.0 MPa to 4.0 MPa for 1 second to 3 seconds and primary compression under conditions of 170° C. to 200° C. at 2.5 MPa to 7 MPa for 1 second to 7 seconds with a release film removed from the pre-compressed anisotropic conductive film, and being left at a temperature of 85° C. and a relative humidity of 85% for 500 hours.

13. A semiconductor device connected by an anisotropic conductive film, the anisotropic conductive film comprising:
a binder resin;
a first radical polymerization material having one or two (meth)acrylate reactive groups in a structure thereof and a second radical polymerization material having at least three (meth)acrylate reactive groups in a structure thereof; and
conductive particles,
the anisotropic conductive film having a moisture permeability of 170 g/m²/24 hr or less and a moisture absorbency of 2% or less,
wherein the anisotropic conductive film has a reliability bubbling area of 20% or less, as measured after being subjected to pre-compression under conditions of 60° C. to 80° C. at 1.0 MPa to 4.0 MPa for 1 second to 3 seconds and primary compression under conditions of 170° C. to 200° C. at 2.5 MPa to 7 MPa for 1 second to 7 seconds with a release film removed from the pre-compressed anisotropic conductive film, and being left at a temperature of 85° C. and a relative humidity of 85% for 500 hours.

\* \* \* \* \*